July 29, 1969 P. F. CONE 3,458,370

FOTOFORM-METALLIC EVAPORATION MASK MAKING

Filed Jan. 26, 1966

INVENTOR.
PETER F. CONE

BY Harry A. Herbert Jr. and
Sherman H. Goldman
ATTORNEYS

United States Patent Office 3,458,370
Patented July 29, 1969

3,458,370
FOTOFORM-METALLIC EVAPORATION MASK MAKING

Peter F. Cone, Bedford, Mass., assignor to the United States of America as represented by the Secretary of the Air Force Filed Jan. 26, 1966, Ser. No. 523,515
Int. Cl. C23f *1/04;* G03c *5/00*
U.S. Cl. 156—11 2 Claims

ABSTRACT OF THE DISCLOSURE

A process for making an evaporation mask for printed circuits which uses a photosensitive glass substrate coated on a surface with a photoresist at portions where holes are to be and also coated on the remaining portions of said surface with a metal such as nickel such that removal of the resist and exposure of the photosensitive glass allows for development of a latent image in the glass and the subsequent removal of the developed portions. An alternative embodiment utilizes a first coating of a transparent conductor on the glass to allow for deposition of the nickel by electroplating.

This invention relates generally to a mask and a method of making masks used to define evaporation regions in processes for vacuum evaporation such as that utilized in the printed circuit art, and more particularly, to an evaporation mask which utilizes a photosensitive glass capable of forming photographic images. The glass is coated with a transparent conductive layer followed by application of a photo resist pattern with the resist in the areas which are to be holes in the final mask. An electroplating of a metal onto the conductive layer, removing the resist, developing the latent image in the photosensitive glass and etching the glass forms the completed mask.

Masks for thin film circuits to define an evaporated region in the vacuum evaporation process require very stringent tolerances and prior art methods resulted in very thin, easily damaged masks which have poor tolerances because of undercutting which occurs in the etching step of the mask preparation. When a large number of holes are to be provided in a mask, the unsupported regions of the mask render it fragile. Most of the prior art methods are unable to achieve both accuracy and sturdiness in the mask.

It is an object of this invention to utilize a mask and a method for preparing a mask with a base of photosensitive glass which is thicker than substrates of masks having a high degree of accuracy, thereby improving the structural integrity of the mask.

It is another advantage of this invention to provide an evaporation mask and method for making it which utilizes a photosensitive glass and eliminates the disadvantage of presently utilized designs by improving the tolerances obtainable.

It is a further object of this invention to provide a method of preparing an evaporation type mask which provides a high degree of accuracy with minimum undercutting.

It is a still further object of this invention to provide an evaporation mask and a process for making it which utilizes standard, conventional, currently available materials that lend themselves to standard mass production manufacturing techniques.

These and other advantages, features and objects of the invention will become more apparent from the following description taken in connection with the illustrative embodiments in the accompanying drawings, wherein:

FIGURES 1 through 5 are schematic cross sections illustrating various stages in the preparation of an evaporation mask utilizing the process of this invention.

Figure 1:
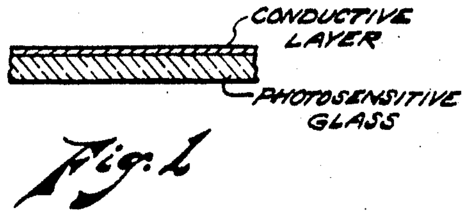

The base for the desired mask, as can be seen in the figures comprises a photosensitive glass manufactured under the trade name "Fotoform," the properties of which are described in Industrial and Engineering Chemistry, volume 41, No. 4, of April 1949, pages 856 through 861, and volume 45, No. 1, of June 1953, pages 115 through 118. Basically, the photosensitive glass contains a lithium salt wherein light sensitizes the glass in order to allow development by means of heat. It is contemplated that the substrate material would be approximately 10 mils thick. FIGURE 1 shows that the base or substrate has applied thereto a thin evaporated chromium layer. The requirements for this layer are that it be electrically conductive and transparent; therefore, this layer is not limited to chromium but may be made of other materials, for example, aluminum. The thickness of the chromium layer is about 1000 A. with from 200 A.–2000 A. being a range which allows sufficient conductivity and passage of light.

Figure 2:
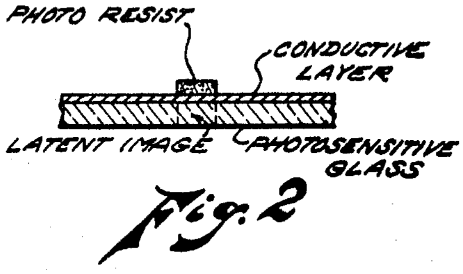

After the vacuum evaporation of the transparent conductive layer, a photo resist pattern is applied on top of the chromium layer such that the resist remains in the areas which are to be holes in the final mask, see FIGURE 2.

The method for providing the resist in the proper pattern could be by means of conventional photographic process such as that used in photolithography. Basically, a negative having the desired pattern is placed on a resist layer and the assembly is illuminated with ultraviolet light. The light passes through the resist and at the same time exposes the Fotoform base so that it would have the same pattern. Removal of the negative and development of the photo resist with a chemical developer would remove the unexposed regions of the resist leaving the photo resist pattern as shown in FIGURE 2, together with the latent image in the Fotoform.

A conventional photo resist such a Kodak thin film resist and a commercial developer therefor are materials capable of being utilized in this process. Of course, any of the commercial resists, developers, and removers could be used in the practice of my invention.

Figure 3:
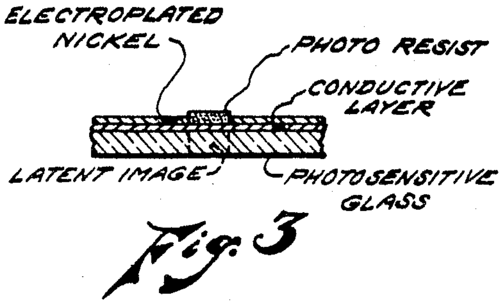

After the built-up Fotoform conductive layer and photo resist have been properly prepared, nickel is electroplated onto the conductive layer, which forms a base therefor, as illustrated in FIGURE 3. Any conventional process for applying the nickel, such as an electroless nickel plating solution, could be used.

Figure 4:
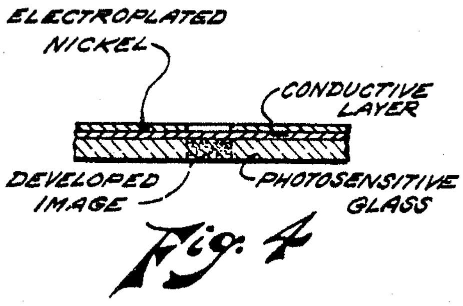

The resist, which is illustrated in FIGURES 2 and 3, is next removed by means of any commercial preparation such as those having a formic acid base. When the resist is removed, the latent image in the Fotoform is developed by means of a heating action of between 200 and 500° C. in air. The developed image, together with the conductive coating and the electroplated nickel with a hole therein, are illustrated in FIGURE 4.

Figure 5:
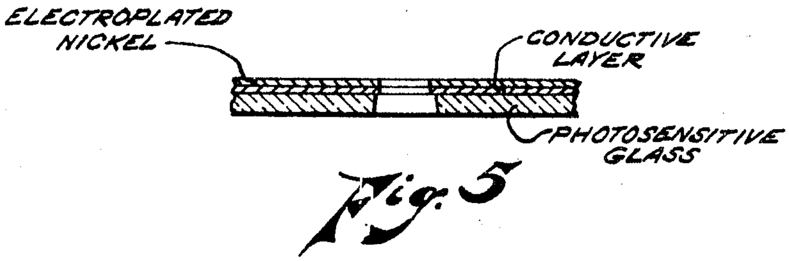

The assembly is next etched from the reverse side of the mask resulting in the mask shown in FIGURE 5. When Fotoform glass is exposed with ultraviolet light, the developed image is attacked 15 to 50 times more rapidly than unexposed Fotoform. Hydrofluoric acid etching from the reverse side of the glass results in a taper about 4°.

Thus, the resultant mask has the advantage of the nickel masks without the disadvantage of having poor strength. In addition, improved tolerances over plain Fotoform masks are also obtained. This type of construction allows for apertures with an accuracy of ±.1 mil or better; the process being limited only by the photography involved in making the photoresist pattern. The electroplated nickel pattern allows for this accuracy.

The Fotoform substrate is not only strong but dimensionally stable and may be as thick as 10 mils because of the small taper produced in the etching step. By avoiding the etching of the nickel layer it has been found that accuracy is improved.

Thus, I have described a mask and method for preparing it which overcomes the disadvantages encountered in the prior art.

An alternate method may be used to produce the mask having the chromium and nickel layers thereon. In this application the Fotoform is coated with the conductive layer which is then followed by the electroplating of nickel thereon. The desired pattern in the plated nickel is created by conventional photo resist and aqua regia etching techniques. Once the hole is etched in the nickel, the image is produced in the Fotoform by exposure to ultraviolet light. Since the nickel is opaque there is no need to use a negative for this portion of the process. Development of the latent image is then made to occur by heating from 200 to 500° C. as described previously. Etching of the glass would then proceed as in the previously described embodiment. In this case, the conductive layer of chromium does not have to be transparent and the exposure for the photo resist and the Fotoform have been isolated. In this embodiment, however, the accuracy is dependent upon the thickness of the nickel layer that has to be etched out. The first described embodiment relies upon the fact that the nickel is not etched for assuring the desired degree of accuracy. In either of the embodiments the chromium conductive layer may be omitted if the nickel is applied by chemical decomposition.

Although the invention has been described with reference to particular embodiments, it will be understood to those skilled in the art that the invention is capable of a variety of alternative embodiments within the spirit and scope of the appended claims.

I claim:

1. A process for making an evaporation mask comprising the steps of applying a layer of photo resist on a substrate of photosensitive glass, exposing said photo resist to ultraviolet light in accordance with a predetermined pattern, developing said photo resist and removing the unexposed portion thereof, applying a coating of nickel on said substrate with said resist defining said pattern through said coating, removing said photo resist, heating said substrate to develop the latent image in said substrate corresponding to said predetermined pattern, said latent image being formed by said exposing to ultraviolet light, and etching said substrate to cause a removal of material corresponding with said predetermined pattern.

2. A process as defined in claim 1 wherein said coating of nickel is applied by electroplating and including the step of applying a transparent, electrically conductive material on said substrate prior to the application of said photo resist to enable said nickel coating to be electroplated.

References Cited

UNITED STATES PATENTS 2,628,160 2/1953 Stookey ............. 156—24

JACOB H. STEINBERG, Primary Examiner

U.S. Cl. X.R.

96—36.2; 156—3, 15, 24